United States Patent [19]

Sheehan et al.

[11] Patent Number: 5,627,453

[45] Date of Patent: May 6, 1997

[54] SMART BATTERY ODOMETER

[75] Inventors: Ed Sheehan, Cedar Park; Leslie Thompson, Austin, both of Tex.

[73] Assignee: Dell USA, L.P., Austin, Tex.

[21] Appl. No.: 372,277

[22] Filed: Jan. 11, 1995

[51] Int. Cl.$^6$ .......................... H01M 10/46; H01M 10/48
[52] U.S. Cl. ................... 320/30; 320/35; 320/39; 320/43; 320/48
[58] Field of Search .................. 320/5, 12, 13, 320/30, 31, 35, 39, 48, 43

[56] References Cited

U.S. PATENT DOCUMENTS

| | | | |
|---|---|---|---|
| 4,885,523 | 12/1989 | Koenck | 320/43 X |
| 4,912,392 | 3/1990 | Faulkner | 320/44 |
| 5,321,627 | 6/1994 | Reher | 320/48 X |
| 5,325,041 | 6/1994 | Briggs | 320/44 |
| 5,349,535 | 9/1994 | Gupta | 320/48 X |
| 5,440,221 | 8/1995 | Landau et al. | 320/31 X |

*Primary Examiner*—Edward H. Tso
*Attorney, Agent, or Firm*—Henry N. Garrana; Mark P. Kahler; Michelle M. Turner

[57] ABSTRACT

A rechargeable battery pack including a microcontroller connected to a voltage measuring circuit and a current measuring circuit for measuring, respectively, the voltage across and the current flowing from a battery. Upon each expiration of a predefined time period during each discharge cycle of the battery, the microcontroller computes the product of the voltage, the current, and the length of the time period, thereby computing the energy expended by the battery over each period of time. An energy variable stored in a nonvolatile memory device associated with the microcontroller for representing the total amount of energy output by the battery over the life thereof is incremented by the computed energy. In one embodiment, a temperature sensing circuit measures the temperature of the battery and the instantaneous energy is adjusted by a temperature factor associated by the measured temperature before being used to increment the value of the energy variable.

20 Claims, 2 Drawing Sheets

SMART BATTERY ODOMETER

TECHNICAL FIELD

The present invention relates to an apparatus and a method for measuring the energy density of a battery and, more particularly, for determining the effective amount of energy expended from a battery throughout its useful life.

DESCRIPTION OF THE PRIOR ART

Rechargeable batteries, particularly those used to power portable computers, are typically warranted to have a useful life span of a specified period of time, such as one year. Although such a time-based criterion is commonly used to define a battery's life for warranty purposes, it is inaccurate because a battery's life is much more dependant on the number of times the battery is charged and discharged, that is, the number of charge/discharge cycles the battery undergoes. Some manufacturers are therefore now expressing battery life in terms of the total number of charge/discharge cycles the battery is expected to successfully undergo. To this end, microcontrollers associated with or integrated into a battery pack have been used to count and report the number of battery charge/discharge cycles.

A disadvantage associated with this method is that a charge/discharge "cycle" must be defined before the microcontroller can determine whether a particular cycle should be counted. More particularly, the problem is one of defining, based on a percentage of a battery's rated capacity, when a battery is charged and/or discharged. For example, a battery may be defined to be charged when its charge exceeds 95% of its rated capacity. However, if the battery is recharged after having been discharged to only 90% of its rated capacity, a full cycle will be counted, even though the battery had hardly been discharged prior to being recharged. Conversely, a battery may be deemed to have been fully discharged when its remaining charge is less than 20% of its rated capacity. In this case, it is possible that the battery may be repeatedly discharged down to 21% and then recharged, with the result being that no discharge cycles are counted, even though the battery clearly was used.

In addition, it is known that the temperature of the battery also affects the efficiency thereof during both charge and discharge cycles. For example, using room temperature as a standard for comparison, discharging a battery at a temperature below room temperature will effect the performance of the battery, whereas discharging that same battery at a temperature above room temperature will degrade the performance of the battery. Moreover, charging a battery at a temperature above a predetermined optimum range will have a negative effect on the battery's performance. The above-described methods do not take battery temperature into account in specifying the life of the battery.

In view of the foregoing what is needed is an alternative system for accurately measuring the amount of energy that has been expended over the life of a battery, without relying solely on the number of charge/discharge cycles undergone by the battery.

SUMMARY OF THE INVENTION

The foregoing problems are solved and a technical advance is achieved by an apparatus and method which accurately defines the life of a battery without counting the charge/discharge cycles. In a departure from the art, an improved "battery odometer" system is provided which defines the life of a battery in terms of the total amount of energy provided by the battery over the life thereof.

In a preferred embodiment, the voltage across the battery and the current flowing from the battery are measured throughout operation of the battery. Upon each elapse of a predetermined time period throughout each discharge cycle of the battery, the amount of energy output by the battery during that time period is determined by computing the product of the measured voltage, the measured current, and the length of the time period. The computed product is then added to a number representing the total amount of energy output by the battery over the life thereof, which number is stored in a nonvolatile memory device associated with the battery.

In one embodiment, a temperature sensor is provided for measuring the temperature of the battery while it is being charged or discharged. Accordingly, in one aspect of the invention, the amount of energy output by the battery during each time period is adjusted by a temperature factor the value of which is dependent on the temperature of the battery during that time period. In another aspect of the invention, if a charge cycle of the battery occurs while the temperature of the battery is above a predefined optimum range, the number stored in the nonvolatile memory will be incremented by an amount equal to the absolute value of the energy output by the battery during the time period adjusted by an appropriate degradation factor.

An technical advantage achieved with the invention is that it provides means by which the life of a battery may be accurately defined.

A further advantage achieved with the invention is that it eliminates the need to define what constitutes a charge level or a discharge level.

A still further advantage achieved with the invention is that it provides a means by which battery warranties may be more precisely defined.

DESCRIPTION OF A PREFERRED EMBODIMENT

Figure 1:
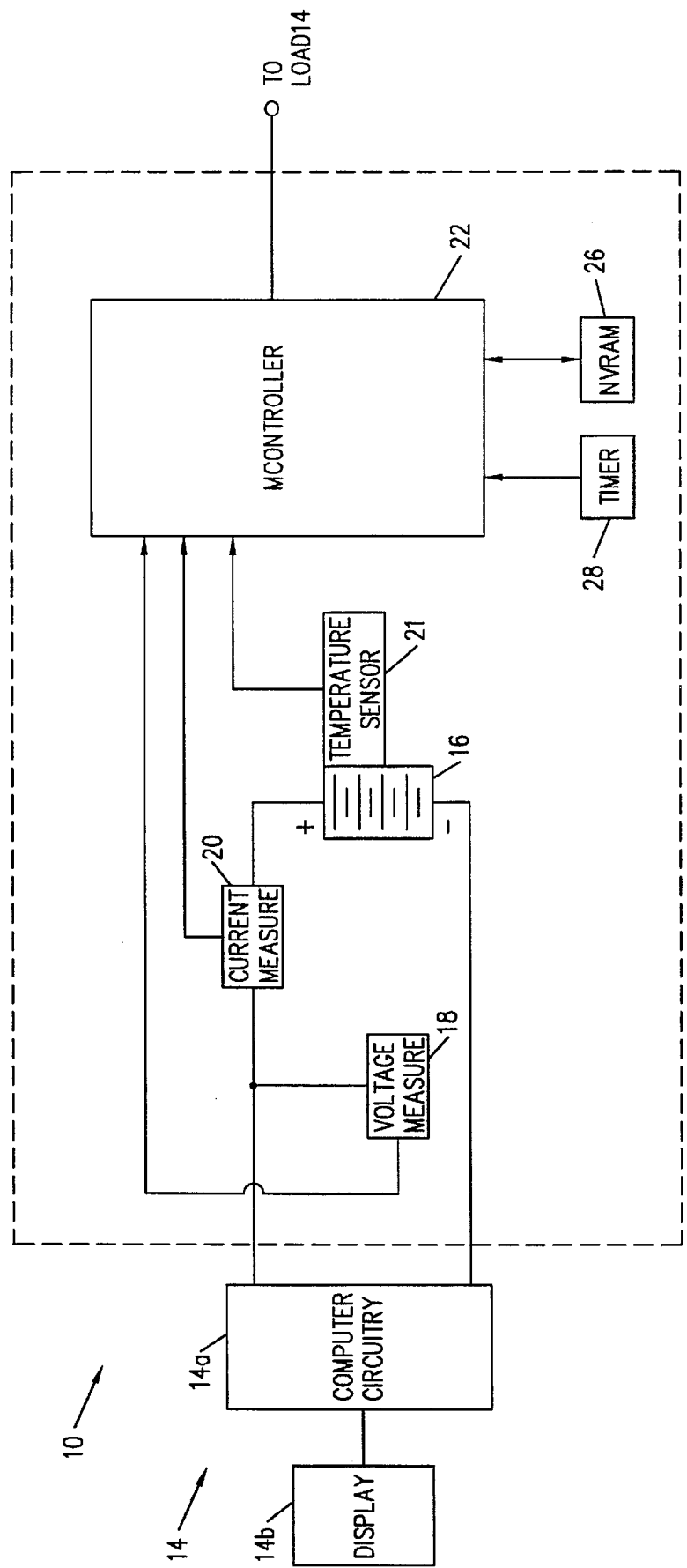
FIG. 1 is a functional block diagram of a battery pack assembly embodying features of the present invention.

In FIG. 1, the reference numeral 10 designates a system in which the present invention is utilized for monitoring the amount of power output by a battery over the life thereof. The system 10 includes a battery pack assembly 12 connected for supplying direct current (DC) power to a load 14. The assembly 12 includes a battery 16, a voltage measuring circuit 18 connected in parallel with the load 14 across the battery 16 for measuring and outputting a signal indicative of the instantaneous voltage across the battery 16, a current measuring circuit 20 connected in series between the battery 16 and the load 14 for measuring and outputting a signal indicative of the instantaneous current output by the battery 16, a temperature sensor circuit 21 for measuring the temperature of the battery 16 and outputting a signal indicative of the measured temperature, and a microcontroller 22 connected to receive the signals output from the circuits 18, 20 and 21.

In a preferred embodiment, the assembly 12 is an integrated battery pack, the battery 16 is a rechargeable battery, such as a nickel cadmium or lithium ion battery, and the assembly 12 is utilized to power the load 14, which may be, for example, a portable computer, such as a laptop computer or a notebook computer. Accordingly, the load 14 represents such components as the computer circuitry 14a of a motherboard and a display 14b of a portable computer, and the output line 24 is connected to the computer circuitry 14a for supplying a data signal thereto indicating the total amount of energy expended by the battery 16. Applications other than the foregoing are contemplated and are also described more fully below.

The voltage measuring circuit 18 and current measuring circuit 20 are each of conventional design and output to the microcontroller 22 analog signals indicative of the instantaneous voltage (in units of volts) and current (in units of milliamperes), respectively, supplied by the battery 16 to the load 14. Similarly, the temperature sensor 21 is also of conventional design and outputs to the microcontroller an analog signal indicative of the measured temperature of the battery 16. Accordingly, it should be understood that the analog signals must be converted to digital signals, for example, by analog-to-digital converters (not shown) within the microcontroller 22, before the signals may be used by the microcontroller 22.

A nonvolatile memory device 26, such as an NVRAM, is connected to, or integrated into, the microcontroller 22 for storing in an "energy output" variable a value equal to the total energy output by the battery 16 over the life thereof, as well as one or more temperature and degradation factors, as will be described. The energy output variable is initialized prior to initial use of the battery 16, and preferably at the time of manufacture, to zero. Also connected to, or integrated into, the microcontroller 22 is a periodic timer 28 for providing signals to the microcontroller 22 indicative of each expiration of a predefined time period, for example, one second.

Upon each expiation of the predefined time period, the microcontroller 22 receives the digitized signals representative of the current and voltage from the circuits 18 and 20, computes the product of the voltage and the current and generates a digital signal indicative of the amount of energy, in units of miliwatt-seconds, output by the battery 16 during the previous time one second time period. It is understood that the element of time is implicitly included in the product, as the time period is unitary (i.e., one second); otherwise time would need to be explicitly included in the product. The microcontroller 22 then increments the value of the energy variable stored in the memory 26 by the computed value of energy output during the time period, such that the value of the energy variable is updated each time period to represent the total mount of energy output by the battery 16 over the life of the battery 16 in units of milliwatt-seconds.

In one embodiment, the temperature of the battery 16 during the time period, as indicated by the temperature sensor 21, may be used to index a corresponding temperature factor stored in the memory device 26, which temperature factor is then used to adjust the computed amount of energy output by the battery 16 during the period, with the adjusted value being added to the stored number. It will be understood by skilled artisans that the exact value of such temperature factors will vary depending on the type of battery 16; however, the value of the temperature factors should accurately reflect the effect of the corresponding temperature on the efficiency of the battery. For example, for a battery operating at room temperature, substantially above room temperature and below room temperature, corresponding temperature factors may be 1, 1.2 and 0.9, respectively.

Figure 2:
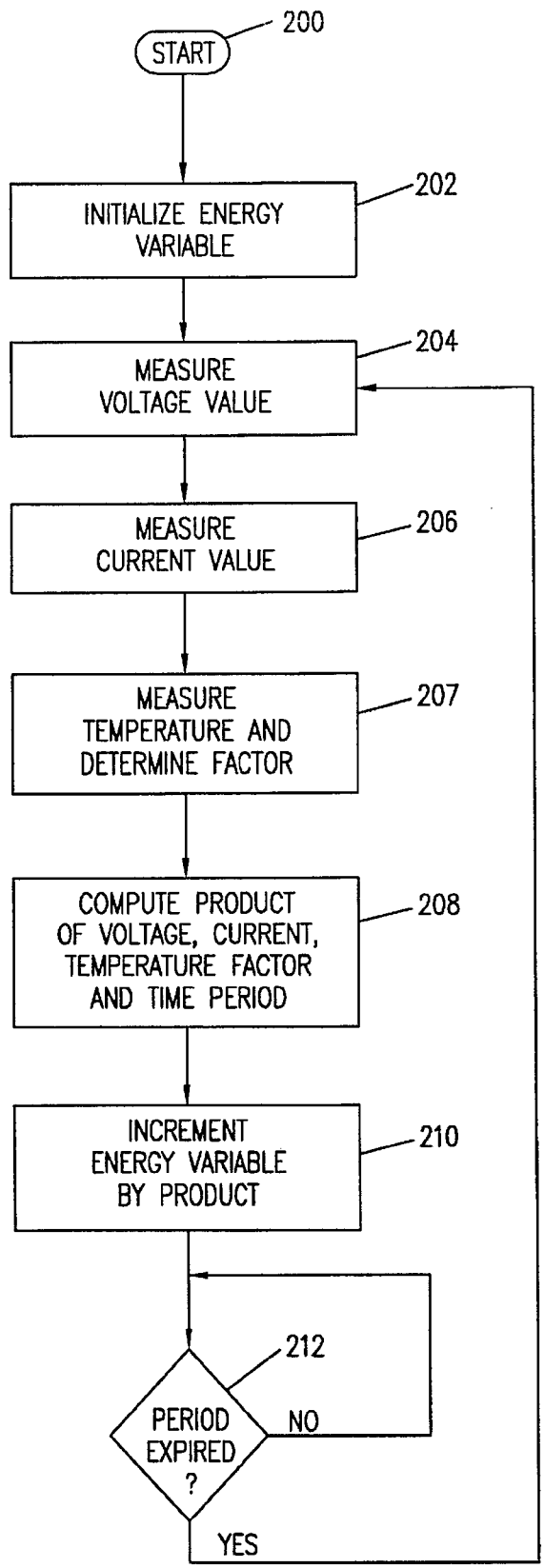
FIG. 2 is a flow chart illustrating the control logic for implementing the system of the present invention.

FIG. 2 is a flow chart illustrating control logic for operating the microcontroller 22 in accordance with the present invention during each discharge cycle of the battery. It is understood that the logic may be implemented by instructions stored in the memory device 26.

In step 200, the microcontroller 22 is powered up and, in step 202, the energy output for storing the total amount of energy output by the battery is initialized to zero. As previously indicated, step 202 would most likely take place at the place of manufacture of the assembly 12. In step 204, upon the expiration of a time period, as indicated by a signal from the timer 28, the voltage across the terminals of the battery 16 is measured and input to the microcontroller 22, which temporarily stores the value in the memory 22. In step 206, the current flowing from the battery 16 is measured and input to the microcontroller 22, which temporarily stores the value in the memory 22. Additionally, if the effects of temperature are to be taken into account, in optional step 207, the temperature of the battery 16 is measured and input to the microcontroller 22, which accesses a look-up table, for example, stored in the memory 26 to determine a temperature factor associated with the measured temperature. In step 208, the microcontroller 22 computes the product of the measured voltage, the measured current, the temperature factor (if available), and the length of the time period, for example, one second. In step 210, the microcontroller 22 increments the value stored in the battery energy variable by the computed product. In step 212, a determination is made whether the next time period has expired. If not, execution remains in step 212; otherwise, execution returns to step 204.

As has been previously indicated, recharging the battery 16 while the battery temperature is above a predefined optimum range will operate to degrade the performance of the battery. Therefore, in an alternative embodiment, the effects on the efficiency of the battery of battery temperature during a recharge cycle of the battery may also be accounted for. In this embodiment, if a determination is made that the battery 16 is being recharged, for example, by detecting that a negative current is being output from the battery 16, and the temperature of the battery is above a predefined optimum range, upon each expiration of the predefined time period during each recharge cycle of the battery 16, the value stored in the energy variable will be incremented by the product of the absolute value of the measured voltage, the measured current and a degradation factor associated with the battery temperature.

The embodiment of the present invention as described herein has many advantages over the prior art, including the ability to accurately measure the life of a battery without the necessity of defining a charge level or a discharge level. A still further advantage is that it enables warranties for rechargeable batteries to be more precisely defined.

It is understood that the present invention can take many forms and embodiments. The embodiments shown herein are intended to illustrate rather than to limit the invention, it being appreciated that variations may be made without departing from the spirit or the scope of the invention. For example, the battery 16 may utilize a variety of technologies such as, for example, nickel-cadmium technology or conventional lead-acid technology as used in automobile batteries.

In further embodiments, the value of the energy value may be output by the microcontroller to the computer 14. In this embodiment, the computer 14 implements software for generating a "power management" screen for displaying various types of status information, such as the amount of power, in units of watt-hours, that has been output by the battery throughout its life and what type of battery technology is being utilized. Such software may also permit a user to adjust computer system parameters, such as the brightness of the display, the volume of a speaker, and the time-outs of certain components which draw energy from the battery.

Although illustrative embodiments of the invention have been shown and described, a wide range of modification, change, and substitution is intended in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A battery pack assembly for a rechargeable battery, comprising:

a microcontroller;

a memory device electrically connected to said microcontroller for storing a number representing a total quantity of energy output by said battery throughout its life;

a voltage measuring circuit for measuring a voltage across said battery and, generating to said microcontroller signals indicative of said measured voltage;

a current measuring circuit for measuring a current output by said battery and generating to said microcontroller signals indicative of said measured current;

said microcontroller being operative, upon each elapse of a predetermined time period during each discharge cycle of said battery, for computing a product of said measured voltage, said measured current, and a length of said time period, said computed product being indicative of an mount of energy output by said battery during said time period, and incrementing said stored number by said computed product.

2. The assembly of claim 1 wherein said microcontroller is electrically connected to a computer having a display, said microcontroller being further operative for outputting to said computer said stored number for presentation on said display.

3. The assembly of claim 1 wherein said microcontroller is electrically connected to a computer having a display, said microcontroller being further operative for outputting to said computer said stored number for further processing by said computer.

4. The assembly of claim 1 further comprising:

a temperature sensor for measuring a temperature of said battery and outputting to said microcontroller signals indicative of said measured temperature;

said microcontroller being further operative, upon each elapse of said predetermined time period during each discharge cycle of said battery, for determining a temperature factor associated with said measured temperature and adjusting said computed product by said temperature factor prior to incrementing said stored number by said computed product.

5. The assembly of claim 1 further comprising:

a temperature sensor for measuring a temperature of said battery during said time period and outputting to said microcontroller signals indicative of said measured temperature;

wherein said microcontroller is further operative, upon each elapse of said predetermined time period during each charging cycle of said battery, for determining whether said measured temperature falls outside a predefined optimum range of temperatures and, responsive to a determination that said measured temperature falls outside said predefined optimum range, for computing an absolute value of a product of said measured voltage, said measured current, said time period length and a degradation factor corresponding to said measured temperature and incrementing said stored number by said absolute value.

6. A battery pack assembly for a rechargeable battery, comprising:

a microcontroller;

a memory device electrically connected to said microcontroller for storing a number representing a total quantity of energy output by said battery throughout its life;

a voltage measuring circuit for measuring a voltage across said battery and, generating to said microcontroller a signal indicative of said measured voltage;

a current measuring circuit for measuring a current output by said battery and generating to said microcontroller a signal indicative of said measured current;

a temperature sensor for measuring a temperature of said battery and outputting to said microcontroller signals indicative of said measured temperature;

said microcontroller being operative, upon each elapse of a predetermined time period during each discharge cycle of said battery, for computing a product of said measured voltage, said measured current, a temperature factor corresponding to said measured temperature and a length of said time period, said computed product being indicative of an amount of energy output by said battery during said time period, and incrementing said stored number by said computed product.

7. The assembly of claim 6 wherein said microcontroller is electrically connected to a computer having a display, said microcontroller being operative to output to said computer said stored number for presentation on said display.

8. The assembly of claim 6 wherein said microcontroller is electrically connected to a computer, said microcontroller being operative to output to said computer said stored number for further processing by said computer.

9. The assembly of claim 6 further comprising a periodic timer having an output connected to an input of said microcontroller for generating signals to said microcontroller indicative of each elapse of said predetermined time period.

10. The assembly of claim 6 wherein said microcontroller is further operative, upon each elapse of said predetermined time period during each charging cycle of said battery, for determining whether said measured temperature falls outside a predefined optimum range of temperatures and, responsive to a determination that said measured temperature falls outside said predefined optimum range, for computing an absolute value of a product of said measured voltage, said measured current, said time period length and a degradation factor corresponding to said measured temperature, and incrementing said stored number by said determined absolute value.

11. A battery pack assembly for a rechargeable battery, comprising:

means for storing a number representing a total quantity of energy output by said battery throughout its life;

means for measuring a voltage across said battery and generating signals indicative of said measured voltage;

means for measuring a current output by said battery and generating signals indicative of said measured current;

means operative upon each elapse of a predetermined time period during each discharge cycle of said battery for computing a product of said measured voltage, said measured current, and a length of said time period, said computed product being indicative of an amount of energy output by said battery during said time period, and incrementing said stored number by said computed product.

12. The assembly of claim 11 further comprising means for displaying said stored number.

13. The assembly of claim 11 further comprising:

means for measuring a temperature of said battery; and means for adjusting said computed product by a temperature factor associated with said measured temperature prior to incrementing said stored number.

14. The assembly of claim 13 further comprising:

means operative upon each elapse of said predetermined time period during each charging cycle of said battery for determining whether said measured temperature falls outside a predefined optimum range of temperatures and, responsive to a determination that said measured temperature falls outside said predefined optimum range, for computing an absolute value of a product of said measured voltage, said measured current, said time period length and a degradation factor corresponding to said measured temperature and incrementing said stored number by said absolute value.

15. A method for tracking an amount of energy output by a battery during its lifetime, the method comprising:

prior to a first use of said battery, initializing a memory location for storing a number representing a total quantity of energy output by said battery during its life; and upon each elapse of a predetermined time period, measuring a voltage potential across said battery and measuring a current output by said battery;

upon each elapse of said predetermined time period during each discharge cycle of said battery:
computing a product of said measured voltage, said measured current, and a length of said time period; and
incrementing said stored number by said product such that, at all times throughout said battery life, said stored number is equal to a total amount of energy output by said battery; and periodically displaying said stored number.

16. The method of claim 15 further comprising, upon each elapse of said predetermined time period during each discharge cycle of said battery:

measuring a temperature of said battery; and adjusting said computed product by a temperature factor associated with said measured temperature prior to said incrementing.

17. The method of claim 15 further comprising, upon each elapse of said predetermined time period during each charging cycle of said battery:

measuring a temperature of said battery;

determining whether said measured temperature falls outside a predefined optimum range of temperatures; and responsive to a determination that said measured temperature falls outside said predefined optimum range:
computing an absolute value of a product of said measured voltage, said measured current, said time period length and a degradation factor corresponding to said measured temperature; and
incrementing said stored number by said absolute value.

18. A method for tracking an amount of energy output by a battery during its lifetime, the method comprising:

prior to a first use of said battery, initializing a memory location for storing a number representing a total quantity of energy output by said battery during its life; and upon each elapse of a predetermined time period:
measuring a voltage potential across said battery;
measuring a current output by said battery; and
measuring a temperature of said battery;

upon each elapse of said predetermined time period during each discharge cycle of said battery:
computing a product of said measured voltage, said measured current, a length of said time period, and a temperature factor corresponding to said measured temperature; and
incrementing said stored number by said product such that, at all times throughout said battery life, said stored number is equal to a total amount of energy output by said battery; and periodically displaying said stored number.

19. The method of claim 18 further comprising, upon each elapse of said predetermined time period during each charging cycle of said battery:

determining whether said measured temperature falls outside a predefined optimum range of temperatures; and responsive to a determination that said measured temperature falls outside said predefined optimum range:
computing an absolute value of a product of said measured voltage, said measured current, said time period length and a degradation factor corresponding to said measured temperature; and
incrementing said stored number by said absolute value.

20. The method of claim 18 further comprising outputting said stored number to a computer for further processing.

* * * * *